United States Patent
Tang et al.

(10) Patent No.: US 11,316,212 B2
(45) Date of Patent: Apr. 26, 2022

(54) METHOD, SYSTEM AND DEVICE FOR ACTIVE BALANCE CONTROL OF BATTERY PACK

(71) Applicant: Guangzhou HKUST Fok Ying Tung Research Institute, Guangzhou (CN)

(72) Inventors: Xiaopeng Tang, Guangzhou (CN); Ke Yao, Guangzhou (CN); Changfu Zou, Gothenburg (SE); Furong Gao, Guangzhou (CN); Wengui Hu, Guangzhou (CN); Yongxiao Xia, Guangzhou (CN); Zhenwei He, Guangzhou (CN); Boyang Liu, Guangzhou (CN)

(73) Assignee: GUANGZHOU HKUST FOK YING TUNG RESEARCH INSTITUTE, Guangzhou (CN)

( * ) Notice: Subject to any disclaimer, the term of this patent is extended or adjusted under 35 U.S.C. 154(b) by 97 days.

(21) Appl. No.: 16/543,087

(22) Filed: Aug. 16, 2019

(65) Prior Publication Data
US 2020/0067146 A1 Feb. 27, 2020

(30) Foreign Application Priority Data
Aug. 23, 2018 (CN) .......................... 201810966180.7

(51) Int. Cl.
*H01M 10/44* (2006.01)
*G01R 31/392* (2019.01)
(Continued)

(52) U.S. Cl.
CPC ...... *H01M 10/441* (2013.01); *G01R 31/3648* (2013.01); *G01R 31/3842* (2019.01);
(Continued)

(58) Field of Classification Search
CPC ............. H01M 10/441; H01M 10/425; H01M 2010/4278; G01R 31/392; G01R 31/3648;
(Continued)

(56) References Cited

U.S. PATENT DOCUMENTS 9,142,980 B2 * 9/2015 Lee .................... H02J 7/0016
9,214,820 B2 * 12/2015 Tsai .................... H02J 7/0014
(Continued)

FOREIGN PATENT DOCUMENTS

CA 2857234 A1 * 7/2013 .......... H01M 10/482

*Primary Examiner* — M Baye Diao
(74) *Attorney, Agent, or Firm* — B. Aaron Schulman, Esq.; Stites & Harbison, PLLC (57) ABSTRACT

A method, system and device for active balance control of a battery pack are disclosed. The method includes: calculating a reference balance current ratio of a battery cell to a battery pack in each batch; calculating an actual balance current ratio of the battery cell to the battery pack at each moment in any batch; allowing the actual balance current ratio to track the reference balance current ratio of the corresponding batch in real time by executing a preset tracking algorithm; and performing balance control on the battery pack according to a tracking result. The system includes a first calculation module, a second calculation module, a tracking module, and a balance control module. The device includes a memory and a processor.

10 Claims, 4 Drawing Sheets

(51) Int. Cl.
  *G01R 31/36* (2020.01)
  *H02J 7/00* (2006.01)
  *H01M 10/42* (2006.01)
  *G01R 31/3842* (2019.01)

(52) U.S. Cl.
  CPC ........ *G01R 31/392* (2019.01); *H01M 10/425* (2013.01); *H02J 7/0013* (2013.01); *H01M 2010/4271* (2013.01)

(58) Field of Classification Search
  CPC . G01R 31/3842; G01R 31/396; H02J 7/0013; H02J 7/005; H02J 7/0014; Y02E 60/10
  USPC ........................................................ 320/132
  See application file for complete search history.

(56) References Cited

U.S. PATENT DOCUMENTS

| | | | | |
|---|---|---|---|---|
| 9,578,466 | B2* | 2/2017 | Xiao | H04W 4/33 |
| 9,620,968 | B2* | 4/2017 | Sugeno | H02J 50/60 |
| 10,641,608 | B2* | 5/2020 | Zhao | G01C 21/16 |
| 10,691,769 | B2* | 6/2020 | Tang | G06F 16/2365 |
| 2012/0256599 | A1* | 10/2012 | Gu | G01R 31/392 |
| | | | | 320/149 |

\* cited by examiner

METHOD, SYSTEM AND DEVICE FOR ACTIVE BALANCE CONTROL OF BATTERY PACK

TECHNICAL FIELD

The present disclosure relates to the technical field of battery management, and in particularly, to a method, system and device for active balance control of a battery pack.

BACKGROUND

Due to the limitation of a manufacturing technology, during the long-term use of the battery pack, a temperature difference between battery cells in a pack may be gradually increased, which may cause strong inconsistency in the battery cells in the battery pack. Moreover, according to the buckets effect, the battery cell of the worst performance determines the performance of the entire battery pack. In addition, the battery pack with poor consistency is also faster in overall aging rate, so that the battery pack is short in service life.

In order to alleviate the buckets effect, the existing art carries out active balancing on the batter pack. The active balancing refers to transferring the remaining energy of a certain battery cell in the battery pack to another battery cell with insufficient energy.

An existing active balance control method is often only effective for a ternary battery with a steep voltage curve, and has a poor effect for a lithium iron phosphate battery with a flat voltage curve. Therefore, the existing method for the active balance control of the battery pack has a narrow application range.

SUMMARY

By utilizing a method, system and device for active balance control of a battery pack capable of prolonging service life of a battery pack and having a wide application range, the foregoing technical problems are solved.

A first technical scheme adopted by the present disclosure is:

A method for active balance control of a battery pack, which includes:

calculating a reference balance current ratio of a battery cell to a battery pack in each batch, where the batch includes a charging batch, a working batch, and a resting batch;

calculating an actual balance current ratio of the battery cell to the battery pack at each moment in any batch;

executing a preset tracking algorithm to allow the actual balance current ratio to track the reference balance current ratio of the corresponding batch in real time; and performing balance control on the battery pack according to a tracking result.

Further, in the step of calculating a reference balance current ratio of the battery cell to a battery pack in each batch, a process of calculating a theoretical optimal solution of the reference balance current ratio includes:

calculating a number of battery strings in the battery pack;

calculating a state of health of each battery cell in the battery pack by using the following formula:

$SoH = Q/Q_{rated}$, where SoH represents the state of health of the battery cell, Q represents a current capacity of the battery cell, and $Q_{rated}$ represents a standard capacity of the battery cell; and calculating a theoretical optimal solution of a reference balance current ratio of each battery cell to the battery pack according to the number of battery strings in the battery pack and the state of health of each battery cell by using the following formula:

$$BCR_j^* = \frac{N \cdot SoH_j}{\sum_{j=1}^{N} SoH_j} - 1,$$

where $BCR_j^*$ represents the theoretical optimal solution of the reference balance current ratio of the j-th battery cell, N represents the number of battery strings in the battery pack, and $SoH_j$ represents the state of health of the j-th battery cell.

Further, the step of calculating a reference balance current ratio of a battery cell to a battery pack in each batch comprises:

calculating the reference balance current ratio of the battery cell to the battery pack by using an inter-batch iteration method.

Further, the step of calculating the reference balance current ratio of the battery cell to the battery pack by using an inter-batch iteration method includes:

classifying the state of the battery pack;

determining the batch of the battery pack according to a switching condition of the state of the battery pack; and calculating the reference balance current ratio of the battery cell to the battery pack by using the inter-batch iteration method according to the batch of the battery pack.

Further, the step of classifying the state of the battery pack includes:

calculating an average current of the battery pack within a preset time range;

determining whether the average current of the battery pack is 0, and if yes, determining that the battery pack is in a resting state; otherwise, executing a next step; and determining whether the average current of the battery pack is greater than 0, and if yes, determining that the battery pack is in a charging state; otherwise, determining that the battery pack is in a working state.

Further, the step of determining the batch of the battery pack according to a switching condition of the state of the battery pack comprises:

if the state of the battery pack is transitioned from other state to the working state at a first moment, determining that the first moment is a start moment of the working batch;

if the state of the battery pack is transitioned from the working state to other state at a second moment, determining that the second moment is an end moment of the working batch;

if the state of the battery pack is transitioned from other state to the charging state at a third moment, determining that the third moment is a start moment of the charging batch;

if the state of the battery pack is transitioned from the charging state to other state at a fourth moment, determining that the fourth moment is an end moment of the charging batch;

if the state of the battery pack is transitioned from other state to the resting state at a fifth moment, determining that the fifth moment is a start moment of the resting batch; and if the state of the battery pack is transitioned from the resting state to other state at a sixth moment, determining that the sixth moment is an end moment of the resting batch.

Further, the step of executing a preset tracking algorithm to allow the actual balance current ratio to track the reference balance current ratio of the corresponding batch in real time comprises:

calculating a tracking error of the actual balance current ratio of the battery cell and the reference balance current ratio by using the following formula:

$$E^{BCR}(k)=BCR^{ref}-BCR(k),$$

where $E^{BCR}(k)$ represents the tracking error of the actual balance current ratio of the battery cell and the reference balance current ratio at a moment k, $BCR^{ref}$ represents the reference balance current ratio of the battery cell, and BCR(k) represents an actual balance current ratio of the battery cell to the battery pack at the moment k.

the actual balance current ratio BCR(k) of the battery cell to the battery pack at the moment k is defined as:

$$BCR(k)=\Sigma_{l=0}^{l=k}i(l)/[\Sigma_{l=0}^{l=k}I(l)],$$

where i(l) represents an balance current of the battery cell at a moment l, and I(l) represents a current of the battery packet at a moment l.

Further, the step of performing balance control on the battery pack according to a tracking result comprises:

determining whether the battery pack is in a platform region, and if yes, performing balance control on the battery pack by using a BCR-based balance method; otherwise, performing balance control on the battery pack by using a voltage-based balance method.

The step of performing balance control on the battery pack by using a BCR-based balance method comprises:

when the battery pack is in the working state, charging the battery cell with a minimum tracking error value; and when the battery pack is in the charging state, discharging the battery cell with the minimum tracking error value.

The step of performing balance control on the battery pack by using a voltage-based balance method comprises:

when the battery pack is in the working state, charging the battery cell with a lowest battery voltage; and when the battery pack is in the charging state, discharging the battery cell a the highest battery voltage.

A second technical scheme adopted by the present disclosure is:

A system for active balance control of a battery pack, including:

a first calculation module, configured to calculate a reference balance current ratio of a battery cell to a battery pack in each batch, where the batch includes a charging batch, a working batch, and a resting batch;

a second calculation module, configured to calculate an actual balance current ratio of the battery cell to the battery pack at each moment in any batch;

a tracking module, configured to execute a preset tracking algorithm to allow the actual balance current ratio to track the reference balance current ratio of the corresponding batch in real time; and an balance control module, configured to perform balance control on the battery pack according to a tracking result.

A third technical scheme adopted by the present disclosure is:

A device for active balance control of a battery pack, including:

a memory, configured to store a program; and a processor, configured to load the program to execute the method for active balance control of a battery pack according to the first technical scheme.

In the present disclosure, a reference balance current ratio and an actual balance current ratio of the battery cell to the battery pack are firstly determined, and real-time tracking is then performed by means of a tracking algorithm, and the balance control of the battery pack is finally achieved. According to the present disclosure, efficient active balance to a lithium iron phosphate battery can be realized, and the application range thereof is wide. In addition, open-loop balancing and closed-loop updating of the lithium iron phosphate battery are realized based on a time direction and a batch direction, the consistency between battery cells in the battery pack is improved, and thus the service life of the battery pack is improved.

DETAILED DESCRIPTION

The present disclosure is further explained and illustrated below with reference to the accompanying drawings and specific embodiments. The step numbers in embodiments of the present disclosure are only provided for convenience of explanation, and are not intended to limit the sequence of steps. The execution sequence of the steps in the embodiments may be adaptively adjusted according to the understanding of those skilled in the art.

Figure 1:
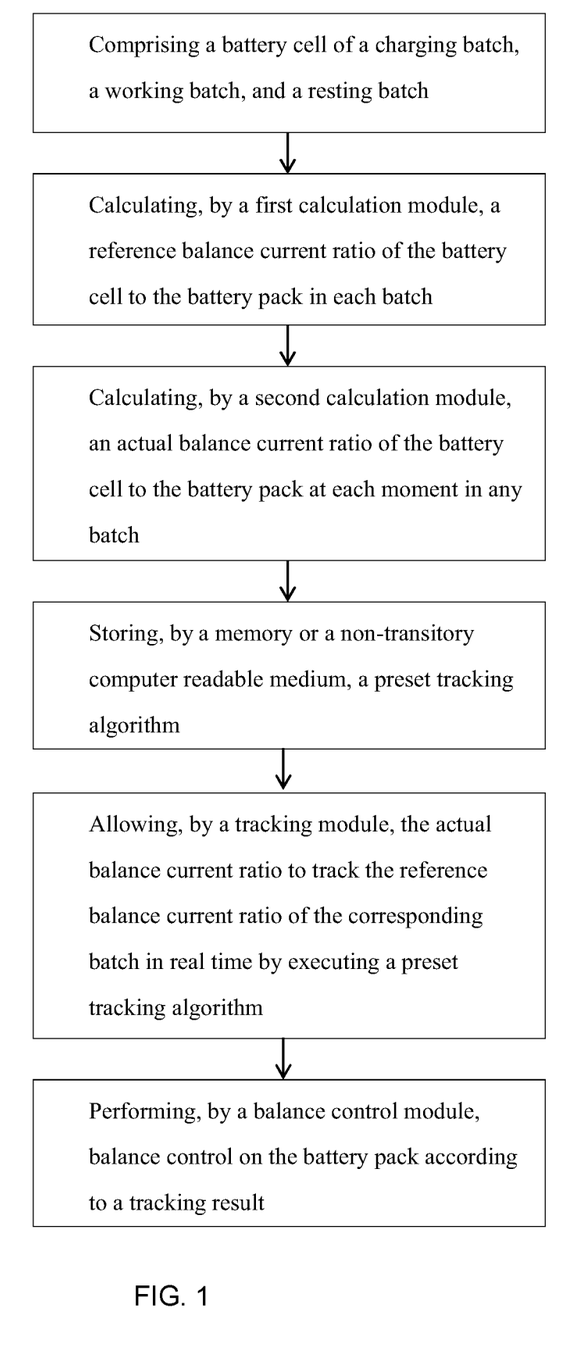
FIG. 1 is a flowchart showing elements of a method for active balance control of a battery pack according to the present disclosure.

Referring to FIG. 1, a method for active balance control of a battery pack is provided. The method includes:

calculating a reference balance current ratio of a battery cell to a battery pack in each batch, where the batch includes a charging batch, a working batch, and a resting batch;

calculating an actual balance current ratio of the battery cell to the battery pack at each moment in any batch;

executing a preset tracking algorithm to allow the actual balance current ratio to track the reference balance current ratio of the corresponding batch in real time; and performing balance control on the battery pack according to a tracking result.

Figure 2:
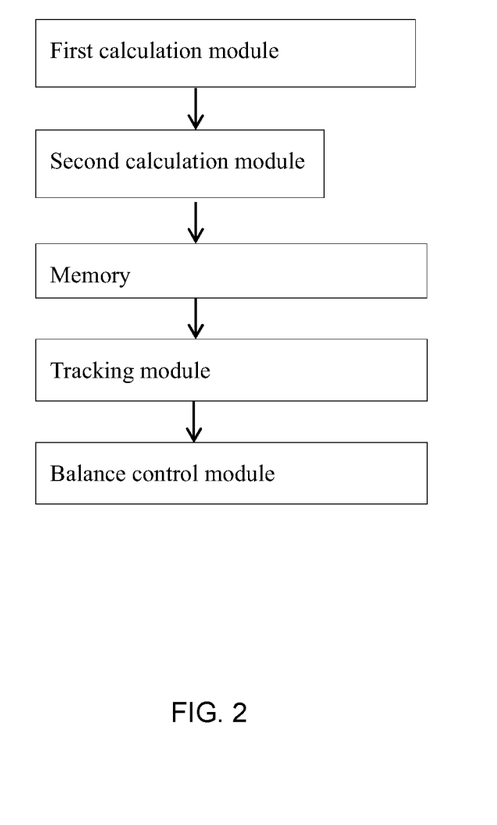
FIG. 2 is a flowchart showing additional elements of a method for active balance control of a battery pack according to the present disclosure.

Referring to FIG. 2, the method elements relating to the first and second calculation modules, the memory, the tracking module, and the balance control module are shown.

Figure 3:
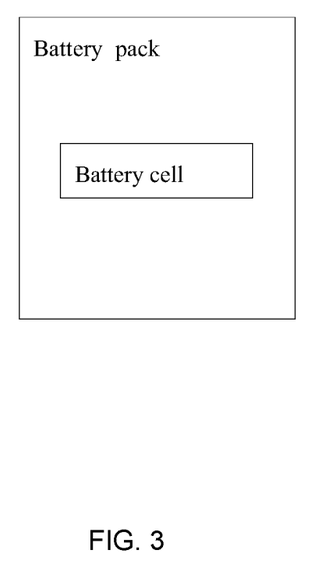
FIG. 3 is a flowchart showing additional elements of a method for active balance control of a battery pack according to the present disclosure.

Referring to FIG. 3, the method elements relating to the battery pack and battery cell are shown.

Figure 4:
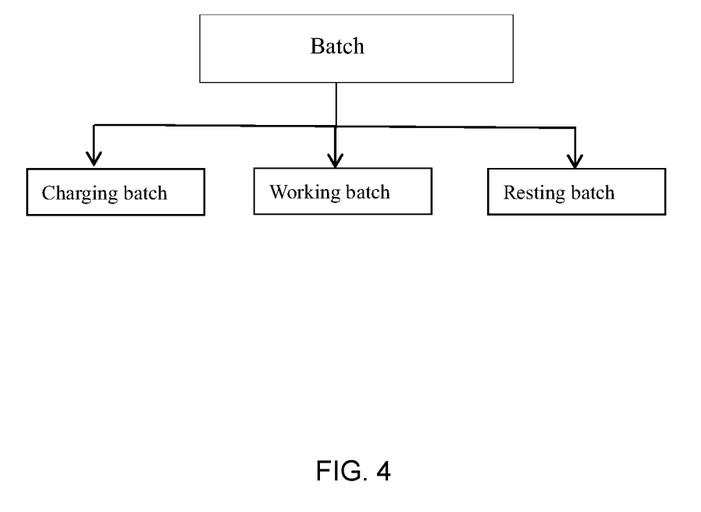
FIG. 4 is a flowchart showing additional elements of a method for active balance control of a battery pack according to the present disclosure.

Referring to FIG. 4, the method elements relating to the batch, the charging batch, the working batch, and the resting batch are shown.

Further, as a preferred embodiment, in the step of calculating a reference balance current ratio of a battery cell to a battery pack in each batch, a process of calculating a theoretical optimal solution of the reference balance current ratio includes:

calculating a number of battery strings in the battery pack;

calculating a state of health of each battery cell in the battery pack by using the following formula:

$$SoH=Q/Q_{rated},$$

where SoH represents the state of health of the battery cell, represents a current capacity of the battery cell, and $Q_{rated}$ represents a standard capacity of the battery cell; and calculating a theoretical optimal solution of a reference balance current ratio of each battery cell to the battery pack according to the number of battery strings in the battery pack and the state of health of each battery cell by using the following formula:

$$BCR_j^* = \frac{N \cdot SoH_j}{\sum_{j=1}^{N} SoH_j} - 1,$$

where $BCR_j^*$ represents the theoretical optimal solution of the reference balance current ratio of the j-th battery cell, N represents the number of battery strings in the battery pack, and $SoH_j$ represents the state of health of the j-th battery cell.

Further, as a preferred embodiment, the step of calculating a reference balance current ratio of a battery cell to a battery pack in each batch comprises:

calculating a reference balance current ratio of a battery cell to a battery pack using an inter-batch iteration method.

Further, as a preferred embodiment, the step of calculating a reference balance current ratio of a battery cell to a battery pack using an inter-batch iteration method includes:

classifying the state of the battery pack;

determining the batch of the battery pack according to a switching condition of the state of the battery pack; and calculating the reference balance current ratio of the battery cell to the battery pack by using the inter-batch iteration method according to the batch of the battery pack.

Further, as a preferred embodiment, the step of classifying the state of the battery pack includes:

calculating an average current of the battery pack within a preset time range;

determining whether the average current of the battery pack is 0, and if yes, determining that the battery pack is in a resting state; otherwise, executing the next step; and determining whether the average current of the battery pack is greater than 0, and if yes, determining that the battery pack is in a charging state; otherwise, determining that the battery pack is in a working state.

Further, as a preferred embodiment, the step of determining the batch of the battery pack according to a switching condition of the state of the battery pack comprises:

if the state of the battery pack is transitioned from other state to the working state at a first moment, determining that the first moment is a start moment of the working batch;

if the state of the battery pack is transitioned from the working state to other state at a second moment, determining that the second moment is an end moment of the working batch;

if the state of the battery pack is transitioned from other state to the charging state at a third moment, determining that the third moment is a start moment of the charging batch;

if the state of the battery pack is transitioned from the charging state to other state at a fourth moment, determining that the fourth moment is an end moment of the charging batch;

if the state of the battery pack is transitioned from other state to the resting state at a fifth moment, determining that the fifth moment is a start moment of the resting batch; and if the state of the battery pack is transitioned from the resting state to other state at a sixth moment, determining that the sixth moment is an end moment of the resting batch.

Further, as a preferred embodiment, the step of executing a preset tracking algorithm to allow the actual balance current ratio to track the reference balance current ratio of the corresponding batch in real time comprises:

calculating a tracking error of the actual balance current ratio of the battery cell and the reference balance current ratio by using the following formula:

$$E^{BCR}(k) = BCR^{ref} - BCR(k),$$

where $E^{BCR}(k)$ represents the tracking error of the actual balance current ratio of the battery cell and the reference balance current ratio at a moment k, $BCR^{ref}$ represents the reference balance current ratio of the battery cell, and $BCR(k)$ represents an actual balance current ratio of the battery cell to the battery pack at the moment k.

The actual balance current ratio $BCR(k)$ of the battery cell to the battery pack at the moment k is defined as:

$$BCR(k) = \Sigma_{l=0}^{l=k} i(l) / [\Sigma_{l=0}^{l=k} I(l)],$$

where $i(l)$ represents an balance current of the battery cell at a moment l, and $I(l)$ represents a current of the battery packet at a moment l.

Further, as a preferred embodiment, the step of performing balance control on the battery pack according to a tracking result comprises:

determining whether the battery pack is in a platform region, and if yes, performing balance control on the battery pack by using a BCR-based balance method; otherwise, performing balance control on the battery pack by using a voltage-based balance method.

The step of performing balance control on the battery pack by using a BCR-based balance method comprises:

when the battery pack is in the working state, charging the battery cell with a minimum tracking error value; and when the battery pack is in the charging state, discharging the battery cell with the minimum tracking error value.

The step of performing balance control on the battery pack by using a voltage-based balance method comprises:

when the battery pack is in the working state, charging the battery cell with a lowest battery voltage; and when the battery pack is in the charging state, discharging the battery cell with a highest battery voltage.

Corresponding to the method illustrated in FIG. 1, a system for active balance control of a battery pack is provided. The system includes a first calculation module, a second calculation module, a tracking module, and a balance control module.

The first calculation module is configured to calculate a reference balance current ratio of a battery cell to a battery pack in each batch, where the batch includes a charging batch, a working batch, and a resting batch.

The second calculation module is configured to calculate an actual balance current ratio of the battery cell to the battery pack at each moment in any batch.

The tracking module is configured to execute a preset tracking algorithm to allow the actual balance current ratio to track the reference balance current ratio of the corresponding batch in real time.

The balance control module is configured to perform balance control on the battery pack according to a tracking result.

Corresponding to the method illustrated in FIG. 1, a device for active balance control of a battery pack is provided. The device includes a memory and a processor.

The memory is configured to store a program.

The processor is configured to load the program to execute the method for active balance control of a battery pack according to the present disclosure.

The present disclosure is suitable for the balance control of the lithium iron phosphate battery in the absence of a model, and realizes the active balance of the battery by using a batch control algorithm according to the repeated characteristics of the battery charging and discharging. The present disclosure defines a balance current ratio, and uses the balance current ratio as an index to perform open-loop balance on the lithium iron phosphate battery in the time direction, and performs closed-loop update on the balance target in the batch direction. The method of the present disclosure may realize efficient active balance of the battery pack without modeling the lithium iron phosphate battery. Specifically, a method for active balance control of a battery pack according to the present disclosure includes implementation steps S1, S2, S3, and S4.

At S1, a reference balance current ratio of a battery cell to a battery pack in each batch is calculated, where the batch includes a charging batch, a working batch, and a resting batch.

In the present disclosure, the balance current ratio $BCR_j(k)$ of the battery cell j at a moment k is defined as:

$$BCR_j(k) = \Sigma_{l=0}^{l=k} i_j(l) / [\Sigma_{l=0}^{l=k} I(l)],$$

where $i_j(l)$ represents an balance current of the battery cell j at a moment l, and $I(l)$ represents a current of the battery packet at a moment l. In practical applications, the measurement of the balance current is difficult. In this case, a reference value provided in a data sheet may be used instead.

In the present disclosure, a process of calculating a theoretical optimal solution of the reference balance current ratio includes steps S101, S102, and S103.

At S101, a number of battery strings in the battery pack is calculated.

At S102, a state of health of each battery cell in the battery pack is calculated by using the following formula:

$$SoH = Q / Q_{rated},$$

where SoH represents the state of health of the battery cell, Q represents a current capacity of the battery cell, and $Q_{rated}$ represents a standard capacity of the battery cell; and At S103, a theoretical optimal solution of a reference balance current ratio of each battery cell to the battery pack is calculated according to the number of battery strings in the battery pack and the state of health of each battery cell by using the following formula:

$$BCR_j^* = \frac{N \cdot SoH_j}{\sum_{j=1}^{N} SoH_j} - 1,$$

where $BCR_j^*$ represents the theoretical optimal solution of the reference balance current ratio of the j-th battery cell, N represents the number of battery strings in the battery pack, and $SoH_j$ represents the state of health of the j-th battery cell.

In practical applications, there is no need to calculate the theoretical optimal solution of the reference balance current ratio, and steps S101-S103 are only used to define the theoretical optimal solution of the reference balance current. In the practical application of the present disclosure, the reference balance current ratio of the battery cell and the battery pack is calculated by using an inter-batch iteration method, that is, step S1 specifically includes steps S111, S112, S113, and S114.

At S111, sampling points of M moments are taken, and an average current $I_{avg}(M,k)$ of the battery cell at the moment k is calculated by using the following formula:

$$I_{avg}(M,k) = \Sigma_{l=k-M+1}^{l=k} I(l) / M.$$

At S112, the state of the battery pack is sorted into a charging state, a working state, and a resting state according to the calculated average current.

Step S112 is specifically as follows:

when the average current is greater than 0, determining that the state of the battery pack is the charging state;

when the average current is less than 0, determining that the state of the battery pack is the working state; and when the average current is equal to 0, determining that the state of the battery pack is the resting state.

At S113, the batch of the battery pack is determined according to a switching condition of the state of the battery pack.

Step S113 is specifically as follows:

if the state of the battery pack is transitioned from other state to the working state at a first moment, determining that the first moment is a start moment of the working batch;

if the state of the battery pack is transitioned from the working state to other state at a second moment, determining that the second moment is an end moment of the working batch;

if the state of the battery pack is transitioned from other state to the charging state at a third moment, determining that the third moment is a start moment of the charging batch;

if the state of the battery pack is transitioned from the charging state to other state at a fourth moment, determining that the fourth moment is an end moment of the charging batch;

if the state of the battery pack is transitioned from other state to the resting state at a fifth moment, determining that the fifth moment is a start moment of the resting batch; and if the state of the battery pack is transitioned from the resting state to other state at a sixth moment, determining that the sixth moment is an end moment of the resting batch.

At S114, the reference balance current ratio of the battery cell to the battery pack is calculated by using the inter-batch iteration method according to the batch of the battery pack.

A formula for calculating a convergence calculation method of the reference balance current ratio is:

$$BCR_{s+1}^{ref} = BCR_s^{ref} + \gamma \overline{G}^{-1} [V_s^*(t_1) - V_s(t_1)]$$

where $BCR_{s+1}^{ref}$ represents a vector consisting of the reference balance current ratio of each battery cell in the (S+1)-th batch, $BCR_s^{ref}$ represents a vector consisting of the reference balance current ratio (e.g., a reference balance current ratio $BCR_j^{ref}$ of the j-th battery cell) of each battery cell in the S-th batch. In this embodiment, an initial value of the first batch is assigned 0, $\gamma=1$, and $$\overline{G} = I \cdot \max \frac{dSoC}{dOCV} + \delta,$$

where I represents a unit matrix, SoC represents a percentage of the remaining battery capacity of the battery cell, OCV represents a battery open-circuit voltage at current SoC, δ is a positive real number representing a margin, $V_s^*(t_1)$ represents an N-dimensional vector consisting of an average voltage of the battery pack at a moment $t_1$ of the S batch, $V_s^*(t_1)$ represents a voltage vector of the battery pack at a moment $t_1$ of the S batch, and $t_1$ refers to the moment when the current batch ends.

Based on the calculation formula of the above convergence calculation method, when a condition s→∞ is satisfied, $BCR_s^{ref}$ is converged to BCR* (i.e., the theoretical optimal solution of the reference balance current ratio).

Moreover, when the percentage (i.e., SoC) of remaining capacity of the battery cell is a known condition, the reference balance current ratio of the present disclosure may be calculated by using the following formula:

$$BCR_{s+1}^{ref} = BCR_s^{ref} + I[SoC_s^*(t_1) - SoC_s(t_1)].$$

where $SoC_s^*(t_1)$ represents a vector consisting of the average values of SoC of the battery cell at a moment $t_1$ of the S batch, and $SoC_s^*(t_1)$ represents a vector consisting of SoC of the battery cell at a moment $t_1$ of the S batch.

In addition, in the step of calculating a reference balance current ratio of a battery cell to a battery pack by using an inter-batch iteration method in the present disclosure, an update strategy of the reference balance current ratio may also be implemented by using the following formula:

$$BCR_{s+1}^{ref} = BCR_s^{ref} + \gamma \overline{G}^{-1}[V_s^*(t_1) - V_s(t_1)],$$

where $BCR^s$ represents an actual balance current ratio of the s batch.

At S2, an actual balance current ratio of the battery cell to the battery pack at each moment in any batch is calculated by using the following formula:

$$BCR(k) = \Sigma_{l=0}^{l=k} i(l) / [\Sigma_{l=0}^{l=k} I(l)],$$

where i(l) represents an balance current of the battery cell at a moment l, and I(l) represents a current of the battery packet at a moment l.

At S3, a preset tracking algorithm is executed to allow the actual balance current ratio to track the reference balance current ratio of the corresponding batch in real time.

Step S3 is specifically as follows: calculating a tracking error of the actual balance current ratio of the battery cell and the reference balance current ratio by using the following formula:

$$E^{BCR}(k) = BCR^{ref} - BCR(k).$$

where $E^{BCR}(k)$ represents the tracking error of the actual balance current ratio of the battery cell and the reference balance current ratio at a moment k, $BCR^{ref}$ represents the reference balance current ratio of the battery cell, and BCR(k) represents an actual balance current ratio of the battery cell to the battery pack at the moment k.

At S4, balance control is performed on the battery pack according to a tracking result.

Step S4 is specifically as follows:

determining whether the battery pack is in a platform region, and if yes, performing balance control on the battery pack by using a BCR-based balance method; otherwise, performing balance control on the battery pack by using a voltage-based balance method.

The step of determining whether the battery pack is in a platform region comprises:

determining whether a decision condition $$\frac{dOCV}{dSoC} < 2 \cdot res$$

is established, and if yes, the battery pack is in the platform region; otherwise, the battery pack is not in the platform region, where res represents a minimum effective resolution of voltage sampling.

The step of performing balance control on the battery pack by using a BCR-based balance method comprises:

when the battery pack is in the working state, charging the battery cell with a minimum tracking error value; and when the battery pack is in the charging state, discharging the battery cell with the minimum tracking error value (rather than the battery cell with a minimum absolute value). For example, the tracking error values of four battery cells are calculated as [−1, −0.01, 0.001, 0.2], discharge treatment is performed on the battery cell with the tracking error value of −1 by the present disclosure.

The step of performing balance control on the battery pack by using a voltage-based balance method comprises:

when the battery pack is in the working state, charging the battery cell with a lowest battery voltage; and when the battery pack is in the charging state, discharging the battery cell a the highest battery voltage.

The above are detailed descriptions of the preferred embodiments of the present disclosure, but the present disclosure is not limited to the embodiments. Those skilled in the art may make various equivalent modifications or substitutions without departing from the spirit of the present disclosure. Such equivalent modifications or substitutions shall fall within the scope of the appended claims.

The invention claimed is:

1. A method for active balance control of a battery pack, the battery pack comprising a battery cell of a charging batch, a working batch, and a resting batch, the method comprising:

calculating, by a first calculation module, a reference balance current ratio of the battery cell to the battery pack in each batch;

calculating, by a second calculation module, an actual balance current ratio of the battery cell to the battery pack at each moment in any batch;

storing, by a memory or a non-transitory computer readable medium, a preset tracking algorithm;

allowing, by a tracking module, the actual balance current ratio to track the reference balance current ratio of the corresponding batch in real time by executing the preset tracking algorithm; and performing, by a balance control module, balance control on the battery pack according to a tracking result.

2. The method for active balance control of a battery pack according to claim 1, wherein calculating a reference balance current ratio of the battery cell to the battery pack in each batch comprises a process of calculating a theoretical optimal solution of the reference balance current ratio, comprising:

calculating a number of battery strings in the battery pack;

calculating a state of health of each battery cell in the battery pack by using the following formula:

$$SoH = Q/Q_{rated}$$

wherein SoH represents the state of health of the battery cell, Q represents a current capacity of the battery cell, and $Q_{rated}$ represents a standard capacity of the battery cell; and calculating the theoretical optimal solution of the reference balance current ratio of each battery cell to the battery pack according to the number of battery strings in the battery pack and the state of health of each battery cell by using the following formula:

$$BCR_j^* = \frac{N \cdot SoH_j}{\sum_{j=1}^{N} SoH_j} - 1,$$

wherein $BCR_j^*$ represents the theoretical optimal solution of the reference balance current ratio of the j-th battery cell, N represents the number of battery strings in the battery pack, and $SoH_j$ represents the state of health of the j-th battery cell.

3. The method for active balance control of a battery pack according to claim 1, wherein calculating a reference balance current ratio of the battery cell to the battery pack in each batch comprises:
calculating the reference balance current ratio of the battery cell to the battery pack by using an inter-batch iteration method.

4. The method for active balance control of a battery pack according to claim 3, wherein calculating the reference balance current ratio of the battery cell to the battery pack by using an inter-batch iteration method comprises:
classifying the state of the battery pack;
determining the batch of the battery pack according to a switching condition of
the state the battery pack; and
calculating the reference balance current ratio of the battery cell to the battery pack by using the inter-batch iteration method according to the batch of the battery pack.

5. The method for active balance control of a battery pack according to claim 4, wherein classifying the state of the battery pack comprises:
calculating an average current of the battery pack within a preset time range;
determining whether the average current of the battery pack is 0, and if yes, determining that the battery pack is in a resting state; otherwise, continuing the execution of said method; and
determining whether the average current of the battery pack is greater than 0, and if yes, determining that the battery pack is in a charging state; otherwise, determining that the battery pack is in a working state.

6. The method for active balance control of a battery pack according to claim 5, wherein determining the batch of the battery pack according to a switching condition of the battery pack state comprises:
determining that a first moment is a start moment of the working batch, if the state of the battery pack is transitioned from other state to the working state at the first moment;
determining that a second moment is an end moment of the working batch, if the state of the battery pack is transitioned from the working state to other state at the second moment;
determining that a third moment is a start moment of the charging batch, if the state of the battery pack is transitioned from other state to the charging state at the third moment;
determining that a fourth moment is an end moment of the charging batch, if the state of the battery pack is transitioned from the charging state to other state at the fourth moment;
determining that a fifth moment is a start moment of the resting batch, if the state of the battery pack is transitioned from other state to the resting state at the fifth moment; and
determining that a sixth moment is an end moment of the resting batch, if the state of the battery pack is transitioned from the resting state to other state at the sixth moment.

7. The method for active balance control of a battery pack according to claim 1, wherein allowing the actual balance current ratio to track the reference balance current ratio of the corresponding batch in real time by executing a preset tracking algorithm comprises:
calculating a tracking error of the actual balance current ratio of the battery cell and the reference balance current ratio by using the following formula:

$$E^{BCR}(k) = BCR^{ref} - BCR(k)$$

wherein $E^{BCR}(k)$ represents the tracking error of the actual balance current ratio of the battery cell and the reference balance current ratio at a moment k, $BCR^{ref}$ represents the reference balance current ratio of the battery cell, and $BCR(k)$ represents an actual balance current ratio of the battery cell to the battery pack at the moment k;
the actual balance current ratio $BCR(k)$ of the battery cell to the battery pack at the moment k is defined as:

$$BCR(k) = \sum_{l=0}^{l=k} i(l) / [\sum_{l=0}^{l=k} I(l)],$$

wherein i(l) represents a balance current of the battery cell at a moment l, and I(l) represents a current of the battery packet at a moment l.

8. The method for active balance control of a battery pack according to claim 7, wherein performing balance control on the battery pack according to a tracking result comprises:
determining whether the battery pack is in a platform region, and if yes, performing balance control on the battery pack by using a BCR-based balance method; otherwise, performing balance control on the battery pack by using a voltage-based balance method;
wherein performing balance control on the battery pack by using a BCR-based balance method comprises:
charging the battery cell with a minimum tracking error value, when the battery pack is in the working state; and
discharging the battery cell with the minimum tracking error value, when the battery pack is in the charging state;
wherein performing balance control on the battery pack by using a voltage-based balance method comprises:
charging the battery cell with a lowest battery voltage, when the battery pack is in the working state; and
discharging the battery cell with a highest battery voltage, when the battery pack is in the charging state.

9. A system for active balance control of a battery pack, comprising:
a first calculation module, configured to calculate a reference balance current ratio of a battery cell to the battery pack in each batch, wherein the batch comprises a charging batch, a working batch, and a resting batch;
a second calculation module, configured to calculate an actual balance current ratio of the battery cell to the battery pack at each moment in any batch;

a memory or a non-transitory computer readable medium, configured to store a preset tracking algorithm;

a tracking module, configured to execute the preset tracking algorithm to allow the actual balance current ratio to track the reference balance current ratio of the corresponding batch in real time; and a balance control module, configured to perform balance control on the battery pack according to a tracking result.

10. A device for active balance control of a battery pack, comprising:

a memory, configured to store a program; and a processor, configured to load the program to execute the method for active balance control of a battery pack according to claim 1.

* * * * *